US006747394B2

(12) United States Patent
Johansson et al.

(10) Patent No.: US 6,747,394 B2
(45) Date of Patent: Jun. 8, 2004

(54) NEAR-RESONANCE ELECTROMECHANICAL MOTOR

(75) Inventors: Stefan Johansson, Uppsala (SE); Olov Johansson, Uppsala (SE); Christer Mattsson, Norrtälje (SE); Anders Jansson, Uppsala (SE); Jonas Eriksson, Uppsala (SE)

(73) Assignee: Piezomotor Uppsala AB, Uppsala (SE)

( * ) Notice: Subject to any disclaimer, the term of this patent is extended or adjusted under 35 U.S.C. 154(b) by 146 days.

(21) Appl. No.: 10/173,766

(22) Filed: Jun. 19, 2002

(65) Prior Publication Data

US 2003/0234596 A1 Dec. 25, 2003

(51) Int. Cl.[7] .............................................. H01L 41/08
(52) U.S. Cl. .................... 310/323.02; 310/332
(58) Field of Search ...................... 310/323.02, 323.12, 310/323.16, 331, 332, 3

(56) References Cited

U.S. PATENT DOCUMENTS

| 4,019,073 A | * | 4/1977 | Vishnevsky et al. | ......... 310/322 |
| 4,857,793 A | * | 8/1989 | Okuno | ................... 310/323.02 |
| 5,089,740 A | * | 2/1992 | Ono | ............................ 310/328 |
| 6,104,122 A | * | 8/2000 | Ishimaru | ................ 310/323.02 |
| 6,218,767 B1 | * | 4/2001 | Akada et al. | .......... 310/323.02 |
| 6,242,846 B1 | * | 6/2001 | Ashizawa et al. | ..... 310/323.02 |
| 6,242,850 B1 | | 6/2001 | Slutskiy et al. | |

FOREIGN PATENT DOCUMENTS

| EP | 0 880 185 A2 | 11/1998 |
| WO | 98/53509 | 11/1998 |

OTHER PUBLICATIONS

Ph Robert et al., "The Electrostatic Ultrasonic Micromotor," J. Micromech. Microeng., V. 7, 1997, pp. 170–172.

* cited by examiner

Primary Examiner—Mark Budd
(74) Attorney, Agent, or Firm—Young & Thompson

(57) ABSTRACT

An electromechanical motor according to the present invention has a stator with a drive element consisting of two serially connected bending sections and a central drive pad, for actuating on a body to be moved. The drive element extends parallel to the body. The drive pad and/or the body is elastic. Preferably, the drive pad has a lower stiffness than the body. The elasticity of the drive pad allows an assimilation of a part of the travelling wave energy applied to the drive element. The backbone of the stator is arranged to restrict the drive element from being removed from the body, but at the same time allow the drive element to be translated towards the body and even leave the mechanical contact with the backbone for shorter periods of time. Support means are preferably designed with convex surfaces in order to allow self-centering of the different parts of the motor.

40 Claims, 7 Drawing Sheets

NEAR-RESONANCE ELECTROMECHANICAL MOTOR

TECHNICAL FIELD

The present invention relates generally to miniature motors and in particular to motors having actuating elements of electromechanical materials

BACKGROUND

Many miniature motors of prior art are based on ultrasonic operation of electromechanical driving elements. Many designs of ultrasonic motors, e.g. U.S. Pat. No. 5,453,653 are based on drive elements extending essentially perpendicular to the surface on which they operate. The dimension in such a direction is often of crucial importance when designing small motors, and such designs are therefore often not applicable. In U.S. Pat. No. 5,136,200, the main extension perpendicular to the operating surface is limited, but the use of a composite operation of bending vibration and expanding/contracting drive portions makes the overall design quite complex. In U.S. Pat. No. 5,233,258 a sheet feeder is disclosed, which comprises an actuator having two active elements connected by a driving portion. The active elements are extendable in the longitudinal direction and cause indirectly a bending and moving action of the driving portion. In EP 0 978 887 an active element forced into resonance moves two drive portions relative to a body. By selecting appropriate resonance frequencies, the drive portions may be caused to vibrate out-of-phase with each other.

General problems with prior art miniature motors are that they either are operated at low speed and with low forces or are operated in a very narrow frequency range around resonance frequencies. Most prior art motors do also require relatively high voltages and currents.

SUMMARY

An object of the present invention is to provide a motor, in which the motor volume surrounding the object is reduced. Another object of the present invention is to provide a motor having a high speed, high driving forces and which can be operated over a substantial frequency range. A further object is to improve power consumption and to reduce the voltages for driving the motors. Yet another object of the present invention is to reduce wear on the moving part of a motor. An object is also to provide motor designs, which have self-centering properties.

The above objects are achieved by an electromechanical motor according to the enclosed patent claims. In general words an electromechanical motor according to the present invention has a stator with a drive element consisting of two serially connected bending sections and a central drive pad for actuating on a body to be moved. The drive element is extended parallel to a surface of the body. The drive pad and/or the body is elastic. Preferably, the drive pad has a lower stiffness than the body. The elasticity of the drive pad allows an assimilation of a non-negligible part of the energy of a travelling wave applied to the drive element. The elasticity of the drive pad preferably restricts the compression time to be less than half the cycle time of a passing travelling wave. The drive element is preferably symmetric around the drive pad. The backbone of the stator is arranged to restrict the drive element from being removed from the body perpendicular to a main displacement direction. However, at the same time it allows the drive element to be translated towards the body and even leave the mechanical contact with the backbone for shorter periods of time. Support means are preferably designed with convex surfaces in order to allow self-centering of the different parts of the motor.

A motor according to the present invention allows the drive element to bend more freely than in prior art motors, which in turn opens up for more motion modes having a higher efficiency Furthermore, the main geometry parallel to the body minimizes space requirements.

BRIEF DESCRIPTION OF THE DRAWINGS

The invention, together with further objects and advantages thereof, may best be understood by making reference to the following description taken together with the accompanying drawings, in which.

DETAILED DESCRIPTION

Most actuator materials could be characterized as electromechanical materials, but in the present disclosure we intend materials that change their shape when an electric voltage or current is applied. Typical examples of electromechanical materials are piezoelectric, electrostrictive and antiferroelectric materials and these materials could be single crystalline as well as polycrystalline or amorphous.

Figure 1:
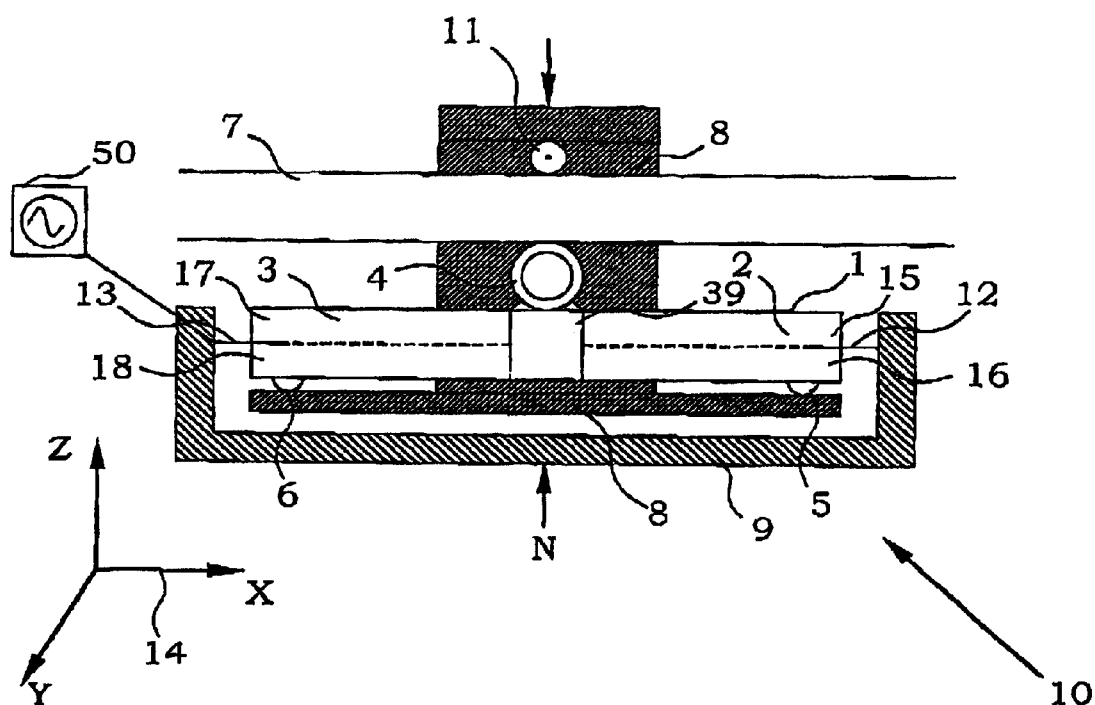
FIG. 1 is an illustration of an embodiment of a motor according to the present invention.

In FIG. 1, the main components of an embodiment of a motor 10 according to the present invention are illustrated. Dimensions are not always illustrated in a true relationship, but are selected to illustrate important functions and relationships in a clear manner. A drive element 1 is arranged essentially parallel with a drive rail 7 to be moved. The drive element 1 consists of two bending sections 2 and 3 with a drive pad 4 at an intermediate position. In other words, the bending sections 2, 3 are arranged in series along the surface of the rail 7 in the direction of the intended main displacement direction of the rail 7. The bending sections 2, 3 are elongated sections that are bendable perpendicular to the main displacement direction. In this embodiment, the bending sections are formed by bimorph piezoelectric elements. Each bimorph element comprising two parallel individually excitable active volumes 15–18, whereby a bending action is achieved by providing the active volumes 15–18 with different voltages.

The drive element is pressed with the drive pad 4 against the drive rail 7 with a force N, a normal force, in the orthogonal direction. This normal force is applied by a spring means 8. In this embodiment, the spring means 8 also comprises a roll 11, acting as a bearing for translational movements of the rail 7. The spring may alternatively be mechanically connected to the backbone portion 9 or not, depending on the particular embodiment. The drive pad 4 is in this embodiment formed by a tube, exhibiting a certain resilient action in the direction perpendicular to the rail surface.

In order to specify the different directions involved in the present motor, a local coordinate system 14 is defined, which will be used for explaining the different directions throughout the present disclosure. The main displacement direction is denoted by x. The plane of the rail 7 surface is parallel to this direction. The normal to the rail 7 surface, i.e. a direction perpendicular to the rail 7 surface is directed in the negative z direction. The drive element is thereby extended substantially in the x-direction, while the bending motion of the bending sections 2, 3 is directed the z-direction. The y-direction is defined as a direction perpendicular to both the x and z directions.

The drive element 1 is held partly fixed to a stator or backbone portion 9 Motion restricting means 12, 13 prohibit the drive element 1 to move in a translational manner in the main displacement direction, i.e. in the x direction. Furthermore, in this embodiment, these attachment means 12, 13 are also responsible to hold the drive element 1 substantially translationally fixed in the y direction. The motion restricting means 12, 13 consist of tabs of flexible materials extended in the x and y direction, thereby giving a high translational stiffness in x and y direction, while providing a low stiffness in the z-direction as well as for rotational motions around the x-axis.

The drive element 1 is furthermore limited in its motion by two mechanical supports 5 and 6. The mechanical supports 5, 6 are situated close to the end of a respective bending section, i.e. at a significant distance from the connection between the two bending sections. In the present embodiment, the mechanical supports 5, 6, are responsible for prohibiting large translational motions of the drive element 1 away from the rail 7, and are formed by two half-spherical portions. These half-spherical portions are in this embodiment attached to the drive element 1 and come into mechanical contact when the drive element 1 and rail 7 are pressed against each other with the spring means 8. The mechanical supports 5, 6 and the motion restricting means 12, 13 are all parts of general attachment means controlling the allowed motion modes and ranges of the drive element.

The total volume of the element is related to the output power. The extention of the drive element along the rail 7 makes it easier to design a motor based on a travelling wave. The small thickness and width of the drive element will make it possible to select a suitable driving frequency that is not extremely high. More compact elements of millimeter size would typically have resonances in the MHz region, which might not be allowed in a number of applications. This type of element that extends along the drive rail makes it easy to design a very compact motor.

Figure 2A:
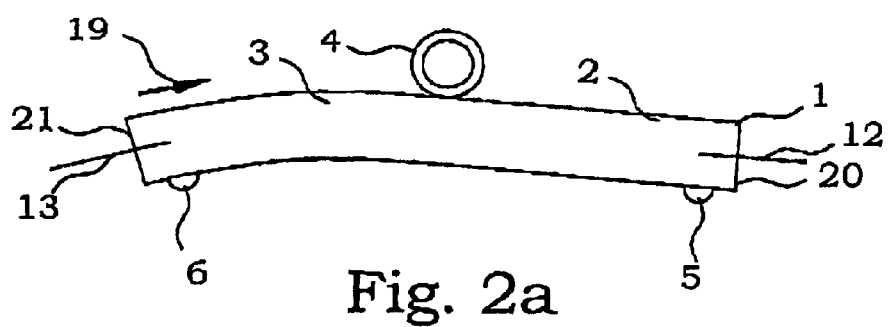
FIGS. 2a and b are schematic illustrations visualizing the motion behavior of drive elements according to the present invention.
Figure 2B:
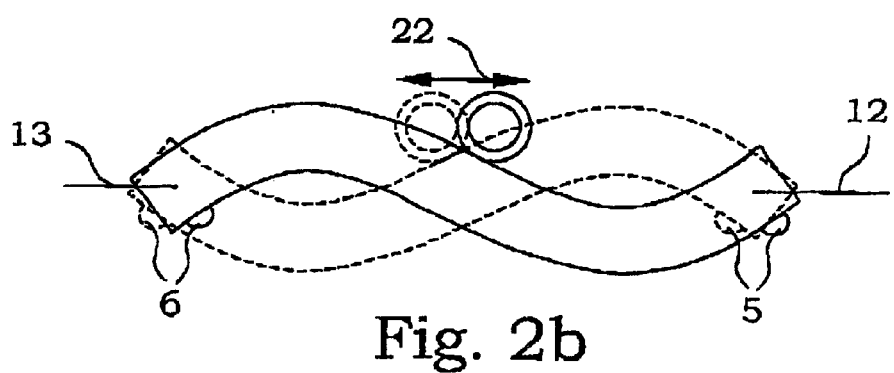

The operation of the motor can be described as a combination of a travelling wave and standing wave ultrasonic motor. This is schematically illustrated in FIGS. 2a–b. Only the main parts of the drive element 1 are illustrated in order to facilitate the understanding of the figures. The motor is typically driven by an electric pulse given to one 3 of the bending sections of the drive element 1. The bending will induce a wave travelling from a first end 21 at the left to right in FIG. 2a, indicated by the arrow 19. If there would be no losses, the drive pad would be free and the motor would be operated at a resonance frequency of the drive element 1, the wave would be reflected at the other end 20 of the drive element 1 creating a constructive interference In FIG. 2b, the behavior at a second order resonance frequency is illustrated. The drive element 1 would thereby start to vibrate in a resonant manner with nodal positions above the supports, 5–6, in the element thickness direction, and below the drive pad 4 in the element thickness direction. The drive element 1 is typically mechanically supported close to the neutral line of the drive element in the tangential direction by attachment means 12, 13. The mechanical supports 5, 6 support the element in the z-direction, or more correctly restrict the motion of the drive element away from the rail, close to the nodal positions. The drive pad 4 would then consequently vibrate in the tangential direction, indicated by the arrow 22, i.e. in the x direction.

Figure 3:
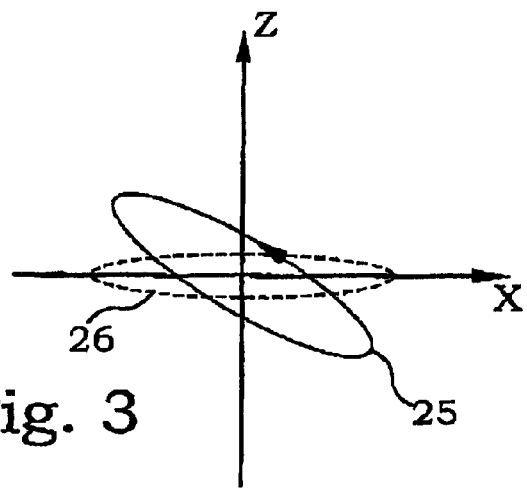
FIG. 3 is an illustration of a typical elliptical trajectory of the contact point of a drive pad according to the present invention.

Without any movement in the orthogonal direction, i.e. the z direction, this tangential movement can not be used for creating a motion of the drive rail. The most straightforward way to achieve an orthogonal movement is to operate the motor at a slightly off-resonant frequency. The superposition of travelling waves that are close but not exactly at the resonant frequency will make the contact point/area of the drive pad 4 to move also in the z-direction and to some extent move along an elliptical trajectory. With an asymmetric electric driving, e.g. when only one bending section is activated at a time, and taking in account that a certain amount of the bending energy is lost before reflection, the orthogonal movement will be further enhanced. The combination of tangential and orthogonal movements will result in that the contact point of the drive pad 4 will move along an elliptical trajectory. Such an elliptical trajectory is illustrated in the diagram of FIG. 3. The angular orientation of the long axis of this elliptical trajectory 25 will depend on how large portion of the vibration energy that will be lost or transferred as well as on the frequency. Typically the long axis will be rotated clockwise for a frequency below the resonant frequency and vice versa. A broken line 26 in FIG. 3 indicates a trajectory for a frequency close to resonance. The drive pad will act as a spring that with a proper matching of spring constant and the equivalent moving mass will further amplify the orthogonal movement. There are two important orthogonal movements of the drive element, a translation in the z direction and a rotation around the y-axis. The latter is usually to prefer when the mechanical supports are not connected to the backbone structure. When driving with bending section 3, the mechanical support 6 will release intermittently. It is also possible to adjust the spring constant of the mechanical supports 5, 6 to improve this orthogonal vibration.

The operation is achieved by supplying the active parts of the drive element with appropriate voltage signals. In FIG. 1, such signals are provided by the voltage supply 50 and transferred over to the drive element via e.g. the attachment means 13. Voltage supplies 50 suitable for such operation are well known by anyone skilled in the art and are commercially available.

The operation can be further improved by a careful design of the various components in the motor. Different aspects of the present invention focus on the various details. First, the elastic properties of the drive pad are considered. The term "drive pad" is in the present disclosure used for denoting any type of mechanical portion that is intended to operate as the contacting portion between the rail and bending sections. Any shapes and materials are intended to be comprised within this term. The drive pad should according to the present invention be made so that it will give an optimum performance for a given application. It has therefore typically to be adapted from case to case. However, the general ideas of how these adaptations should be performed are presented here below.

Let us first consider a drive pad 4, e.g. of FIG. 1, that would be extremely stiff and having an extremely high friction against the drive rail 7. The drive rail 7 is here considered to be infinitely stiff. When the bending section 3 is activated, a bending wave will start to travel from the left to the right. At the fairly rigidly fixed drive pad position, a larger portion of the travelling wave energy, typically more or less the entire energy, will be reflected by the drive pad 4 and it will be difficult to get a stable operation in general. Stiff drive pads and/or bodies give normally an unstable motion and it is difficult to obtain requested properties, such as high forces and high speed. Furthermore, if operation can be achieved, the wear at the driving surfaces is large due to the large forces building up in the contact surfaces during the short time of contact between drive pad and drive rail. The lifting distance perpendicular to the main displacement direction becomes small. This is particularly important close to a resonance frequency sine the middle node hardly moves with non-elastic drive pads. The driving pad should therefore be elastic.

If one on the other hand would make the drive pad 4 very soft, then the travelling wave would pass the drive pad 4 without any significant energy transfer to the drive rail 7. This illustrates that the drive pad 4 should be designed carefully, to give an optimum energy transfer between the travelling wave and the rail 7. In the orthogonal direction—the z direction—the drive pad 4 should typically be compressed during a time period that is a fraction of the driving cycle time when the travelling wave passes. A compression of about half the cycle time has often been considered to be an ideal value for standing wave ultrasonic motors with elliptical contact point trajectories. However, experiments made on motors according to the present invention have, however, normally given better results for shorter contact times. This is probably an effect of the proposed off-resonance operation, where the elliptical trajectories are tilted.

The drive pad should thus be elastic. Preferably it has a stiffness that is lower than of the body to be moved. Furthermore, the elasticity of the drive pad should allow for assimilation of a non-negligible portion of the energy of the travelling wave passing. The drive pad is typically made with a mass small enough to be neglected in comparison with the drive element mass and, in most embodiments, with resonance frequencies well above the operation frequencies of the motor.

Figure 4A:
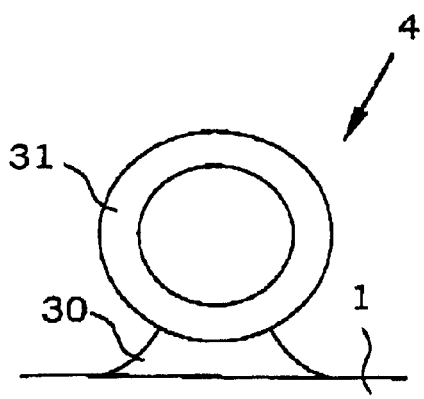
FIGS. 4a–c are illustrations of different embodiments of drive pads according to the present invention.
Figure 4B:
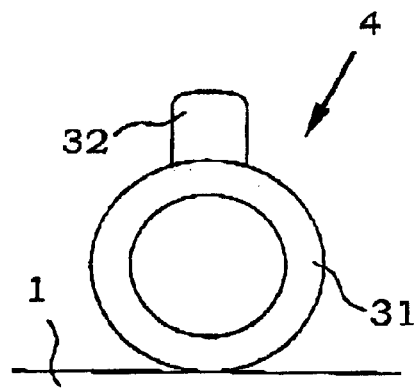

The drive pad 4 is conveniently made of a tube of metal, ceramic or polymer and the spring constants in the orthogonal and tangential directions are therefore to a large extent given by the geometrical dimensions and the material properties. However, also other parameters may be important. The thickness of a glue joint 30 fixing the tube 31 to the drive element 1, as illustrated in FIG. 4a, or an additional friction pad 32, as illustrated in FIG. 4b, on top of the tube 31, will for instance change the spring constant, at least in the tangential direction. It has in fact been noticed that a magnification of the stroke can be obtained with the right combination of parameters. Often the choice of frequency range and the friction coefficient play important roles to obtain ideal conditions.

Figure 4C:
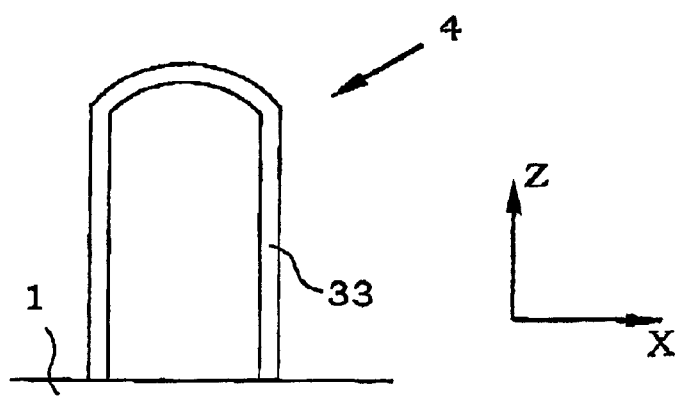

The drive pad 4 can also be designed on purpose to have different spring constants in the tangential and orthogonal directions, (x and z directions). One example is illustrated in FIG. 4c. Here, a drive pad 4, having a general rectangular cross-section is illustrated. The top portion 33 is slightly curved, and the entire structure will have a high spring constant in the z direction, i.e. the drive pad 4 is fairly stiff for forces in the z-direction. The spring constant in the x-direction is, however, much less, giving the drive pad 4 a much softer appearance in this direction.

It should be pointed out that operation also could be achieved when the drive pad 4 does not detach entirely from the drive rail 7. The efficient instant pressure against the drive rail 7 will, however, be lower when the pad 4 is retracting away from the rail 7. This will give rise to a so-called "stick-slip" type of driving mechanism for creation of the resulting movement of the drive rail 7.

In practice, the drive rail 7 can have a stiffness that is not negligible. This means that both the stiffness of the drive pad 4 and that of the drive rail 7 preferably have to be considered and designed together to give the desired dynamic response of a travelling wave in the drive element. As is easily understood, an elastic rail 7 could then be used. This usually leads to certain complications since the mass of the rail seldom can be neglected and the whole rail might start vibrating in an undesired manner. The use of a stiff rail in combination with an elastic drive pad is therefore preferred.

As described above, the spring properties of the drive pad and drive rail will increase the orthogonal movement of the drive pad contact point, but in order to get a good trajectory, also the mechanical supports should be considered. The mechanical supports should therefore preferably also be designed to give the right dynamical response to the drive element. In a similar way as for the drive pad, the spring constant associated with the mechanical support can be used to improve the performance. Here, the spring constant of the mechanical support in combination with related parts of the stator has to be considered. In an embodiment of a motor according to the present invention a flexible printed circuit board and a spring, can be used in the connection between the drive element and the stator backbone to improve the operation performance of the motor. Normally, the flexible printed circuit board should be stiff enough to give a fast response in the x-direction but not too stiff to cause resonant vibrations. The spring is also normally designed to not impose any large vibrations at the operation frequency interval. The spring constant of the spring and the equivalent masses can, however, be tuned to give a semi-resonant magnification of the motion of the drive pad in the tangential direction (x direction).

The exact positions of the mechanical supports are not that crucial for non-resonant operation. Typically, the nodal positions for the 2$^{nd}$ bending mode are used when high-speed operation is desired. However, other resonant modes, in particular even orders of bending modes are possible to use. When using even orders of bending modes, i.e. modes having an odd number of nodes, a symmetrical design of the drive element is preferred. The behavior of the drive element will in such cases be symmetric, independent of at which end the travelling wave is induced. The drive pad is then situated at the symmetry line and the mechanical supports at equal distances from the symmetry line. However, in applications, where requirements for motion in the positive and negative x-direction, respectively, differ, an asymmetric design of the drive element may be advantageous.

Figure 5:
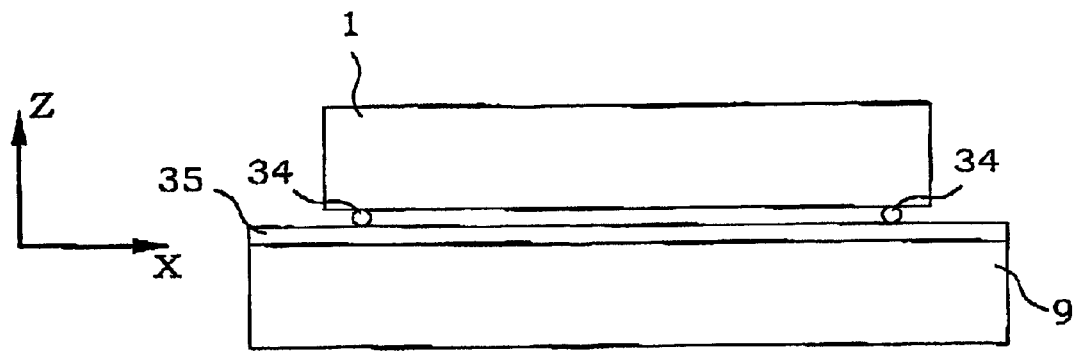
FIG. 5 is an illustration of an attachment arrangement for a drive element according to the present invention.

The mechanical supports could be formed in different ways. In a very simple case, illustrated in FIG. 5, the mechanical supports are solder joints 34 between the drive element 1 and a flexible printed circuit board 35. The flexible printed circuit board 35 is then in turn fastened to the stator 9. The arrangement provides a double function of the joints 34, both as attachment means and as mechanical support means. First, translational movements in the x and y directions are essentially prohibited, due to the connection with the stator 9 and the limited elasticity within the plane of the flexible printed circuit board 35. Secondly, the stator 9 prohibits the drive element to move too far in the negative z direction, while the flexible printed circuit board 35 provides a flexibility for tilting the solder joints 34 in small angles around an axis directed in the y direction.

Figure 6A:
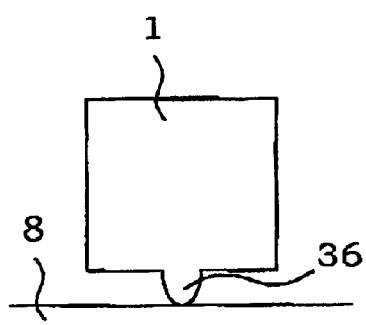
FIGS. 6a and 6b are illustrations of different embodiments of mechanical support structures of drive elements according to the present invention.
Figure 6B:
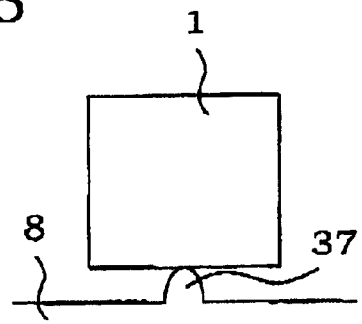

The mechanical supports can also be formed by other features that are part of or attached to the drive element, spring or stator in some other way. According to the present invention, it is preferable to use a contact between a first surface having a convex curvature and a second flat surface or two curved surfaces. The first surface may e.g. have a half-spherical shape, while the second surface may be essentially planar, having holes or dimples with flat or concave surfaces. The first surface may be present at the drive element and the second surface at the stator/spring, or vice versa. In FIG. 6a, the drive element 1 is provided with a protruding portion 36, where the region around the tip has a convex shape. The protruding portion 36 rests against the spring 8. (Note that in other embodiments, the drive element may come into direct contact with the stator instead.) In FIG. 6b, the conditions are reversed. Here the spring 8 comprises a half-sphere 37, which is held in contact with a surface of the drive element 1.

Figure 7:
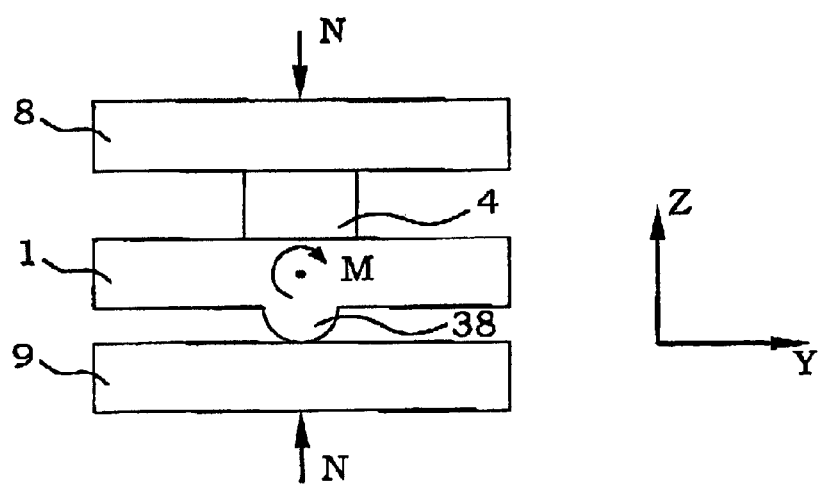
FIG. 7 is a schematic illustration of the advantages of using convex support structures for supporting drive elements.

When testing motors according to the present invention, there is a good experience of using half-spheres made of steel or similar materials as mechanical supports attached to the drive elements themselves. Ball-bearing balls could for instance be used. Such an arrangement is schematically illustrated in FIG. 7, in a direction along the main displacement direction, i.e. along the x-direction. The half-spheres 5 have many advantages. One important property is that they allow the drive element 1 to align the drive pad 4 against the drive rail 7. With an even pressure distribution along the contact area between the rail 7 and the drive pad 4 and when being perfectly aligned, a cylindrical drive pad 4 would have a linear contact in the y direction against a flat drive rail surface. This is important for a proper operation, since a too large angular alignment error, which gives a too large tilting moment M, would decrease the motor performance considerably. Due to the small cross-section, the moment of inertia around the x-axis will be small and the rotational acceleration around this axis will be fast. The drive pad might therefore not release properly. The effective spring constant might also change if there is a too large tilting moment M.

Another important function with the half-spheres 38 is to stabilize the drive element 1 against such undesired tilting moments M. This is because the moment of inertia will increase substantially due to mechanical contact with the masses of parts such as the spring 8 or stator 9. This stabilization can also be achieved with other parts of the motor.

A third function with the half sphere 38 is that it can improve the movement of the drive element 1 itself. If the stator backbone is not mechanically connected with the drive element but rather pressed against it with the spring force, then the stator backbone will not be subjected to any large bending restraining forces and moments.

Furthermore, drive elements that are fixed against a carrier can not bend as much as an element that is only pressed against the bearer. Prior art elements therefore required high voltages and high power to give the same performance as in the present invention. It is moreover much more difficult to obtain a large z movement of the drive pad of a fixed drive element than for a drive element that is free to move somewhat in the direction towards the body to be moved. The drive element is thus free in the sense that there are no fixed mechanical connections restricting any motion towards the body. Motions away from the body are however restricted, since the drive element then will meet the stator backbone or spring, depending on embodiment. The "free" drive element will in a typical operation leave the mechanical contact with the backbone at one side, which is favorable for the entire operation. The drive element will thereby have a larger degree of freedom, enabling new motion modes.

The main part of the drive element 1 can be made in many different ways. In one preferred embodiment, the drive element 1 consists of a monolithic piezoelectric beam with two bending sections 2 and 3, as illustrated in FIG. 1. In between the bending sections 2, 3, there is a passive part 39, on which the drive pad 4 is attached. The bending sections 2, 3 in this particular embodiment consist of two volumes 15–18 of piezoelectric material that can be activated by an electric field (not shown in the figure). Typically, a multi-layer construction is used to reduce the drive voltage. The bending will be caused by the bimorph construction. With an electric field in the orthogonal direction (z direction), the piezoelectric material 15–18 will shrink or expand in the longitudinal direction of the drive element 1, the tangential direction (x direction). If only one of the active volumes, e.g. 17 or 18, is activated, a bending of the bending section 3 will occur.

Figure 8A:
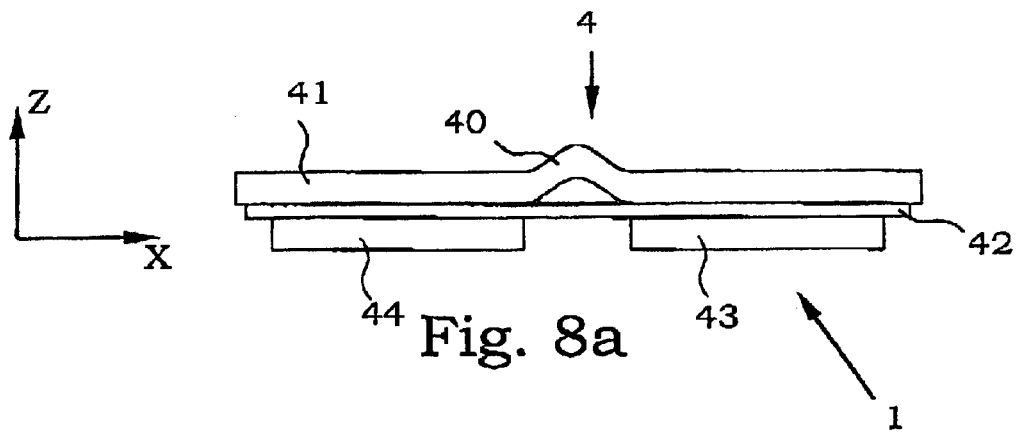
FIGS. 8a and b are illustrations of embodiments of unimorph drive elements according to the present invention.

A similar behavior can be achieved by a sandwich construction with one piezoelectric volume and other materials. One such construction is shown in FIG. 8a. A metallic sheet 41 is formed with a protruding section 40. This protruding section 40 will act as the drive pad 4 of the drive element 1. A flexible printed circuit board 42 is attached to the metal sheet 41, typically by glue. On the other side of the flexible printed circuit board 42 are electromechanically active elements 43 and 44 attached. The active elements 43, 44 are in this embodiment piezoelectric sheets with electrodes parallel to the metal sheet 41. When activating the piezoelectric sheets 43, 44, the sandwich of metal 41 and piezoelectric sheets 43, 44 will bend due to unimorph action. Two bending sections with an intermediate passive section can hence easily be constructed in this way. Each of the bending sections comprises two portions; one active electromechanical element 43, 44 and one passive metal sheet portion 41. The two electromechanical elements 43 and 44 do not need to be two separate parts but could be made in one piece.

Figure 8B:
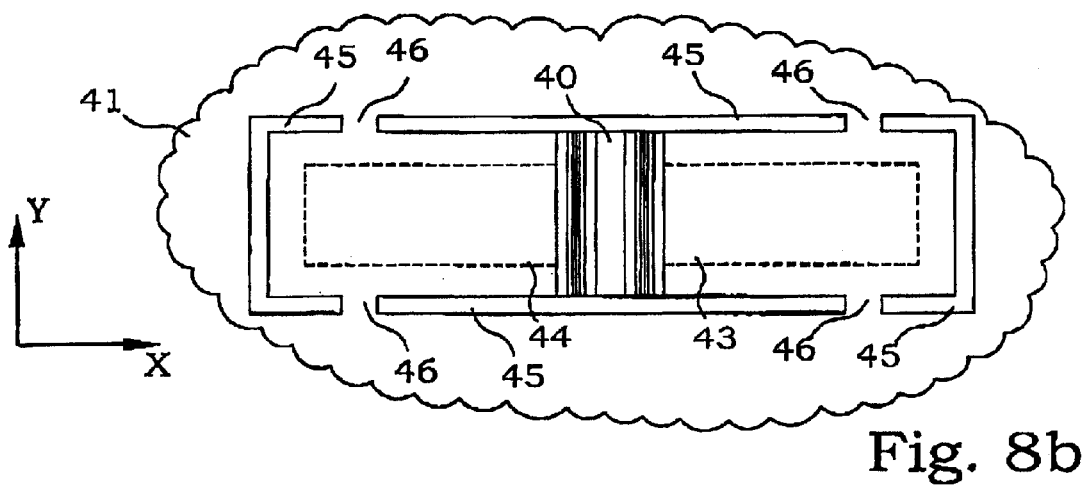

As shown in FIG. 8b, illustrating a top view of the drive element 1, the mechanical supports in this case could be bending hinges 46 formed by etching holes 45 in a larger metal sheet 41. Such hinges 46 prohibits efficiently any translational motions, but allows for smaller rotational movements around an axis in the y direction. The hinges 46 are thus simultaneously attachment means and mechanical support means. The electromechanical elements 43, 44 are here attached below the metal sheet 41.

Figure 9:
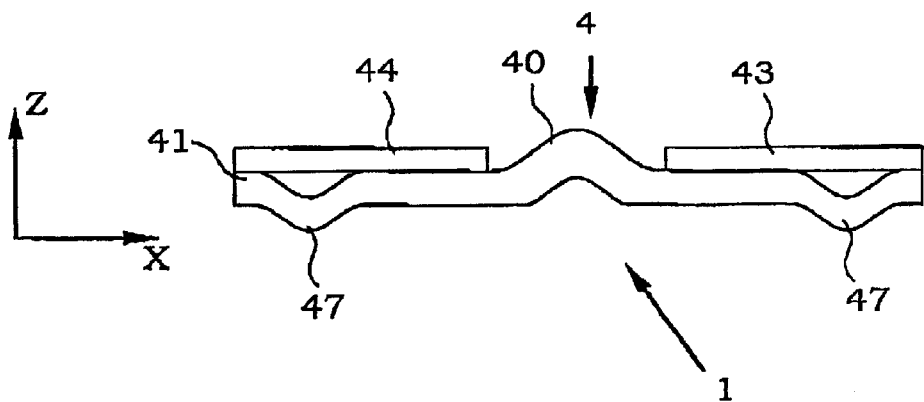
FIG. 9 is another embodiment of an unimorph drive element according to the present invention.

The electromechanical elements could be attached to either side or both sides of the metal sheet depending on the application. FIG. 9 illustrates an embodiment of a drive element intended for use with an external spring. Here it was concluded that it would be convenient to have integrated spherically protrusions 47 of the metal sheet 41, acting as mechanical supports. The electromechanical elements 43 and 44 are in this case placed on the same side as the drive pad 4.

In many cases, even the metal sheet 41 itself can be used as the spring means, creating the necessary force in the orthogonal z direction. One particular advantage with this is that the metallic sheet 41 can be made to vibrate at the same time as the drive element 1 vibrates to increase the x-motion of the contact point of the drive pad 4. If the same behavior is desired in a motor based on the drive element of FIGS. 8a–b, the spring could be designed to have the proper vibration behavior.

Figure 10:
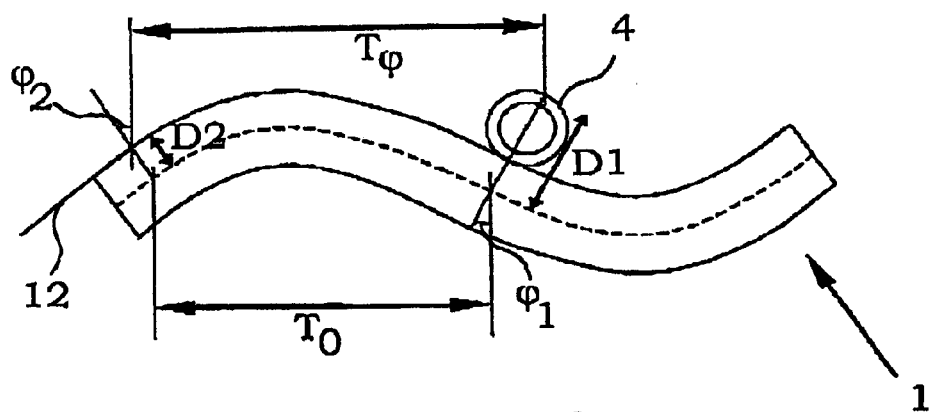
FIG. 10 is an illustration explaining relations between attachment points and tangential motion of the drive pad.

The position of the attachment points of the drive elements is important for optimized performance. This is illustrated in FIG. 10. The mechanical attachment prohibiting translation in the tangential or x direction should be situated as close to the rail as possible. Often, the space is limited, whereby a position close to the neutral line of the drive element 1 or on the same side of the drive element 1 as the drive pad 4 would be a preferred solution. This is easily seen in the exaggerated drawing of the tangential vibrations of the drive element 1. When the drive element 1 bends according to FIG. 10, then the contact point of the drive pad 4 will bend to the right since the drive element more or less bends around the neutral line in the center. If the distance between the attachment point and the drive pad in an unbended condition is $T_0$, the position $T_\Phi$ of the contact point of the drive pad relative to the attachment point in a bent state will be:

$$T_\Phi = T_0 + D1 \cdot \sin \Phi_1 + D2 \cdot \sin \Phi hd\ 2$$

where D1 is the distance from the neutral line to the contact point of the drive pad, D2 is the distance above the neutral line, where the attachment means 12, 13 have their attachment point, and $\Phi_1$ and $\Phi_2$ are the bending angles at the drive pad and at the attachment point, respectively. The attachment means 12, 13 are in this embodiment, unlike the embodiment of FIG. 1, fastened at the upper part of the drive element. Here it is seen that the tangential motion of the contact point of the drive pad is increased also for a increased D2 distance. A D2 distance of a "negative" value, i.e. an attachment point below the neutral line will instead reduce the tangential movement. The effect is thus that an attachment point on the same side of the neutral line as the drive pad will enhance the tangential movement of each step of the motor. This is thus particularly important if a high speed is desired.

In the sandwich type of drive element, see e.g. FIG. 8a, the tangential attachment can be chosen according to the demands of the application. With an attachment along the flexible printed circuit board 42, the tangential attachment will essentially be along the neutral line that creates no unnecessary moments in the construction.

In the present disclosure, "rail" and "body" are used to denote the part of the motor that is to be moved. These terms should be interpreted in a wide sense, comprising all types of objects having a surface against which the drive element can operate. The rail or body to be moved can also be designed to improve the performance of the motor operation in many different ways. The stiffness and bending vibrations are the first two parameters to consider.

The stiffness in combination with the chosen drive pad should match the travelling wave cycle time. The bending vibrations should preferably be negligible in the frequency operation range. Next the friction coefficient and wear characteristics have to be selected. These parameters are usually connected to the particular application. Long lifetime usually demands low wear and normally the friction coefficient will also be reduced. With a reduced friction coefficient, the tangential forces will also be lower and the compromise is often between high forces or low wear. The flatness and roughness are also of importance but with cylindrical or similar drive pads, the flatness is not the crucial. The roughness should, however, be less than or of the same order as the drive pad movement in the orthogonal direction (z direction). As has been mentioned earlier, operation can also be achieved without any total clearance between drive pad and rail and in this case the roughness also has to be small.

Figure 11:
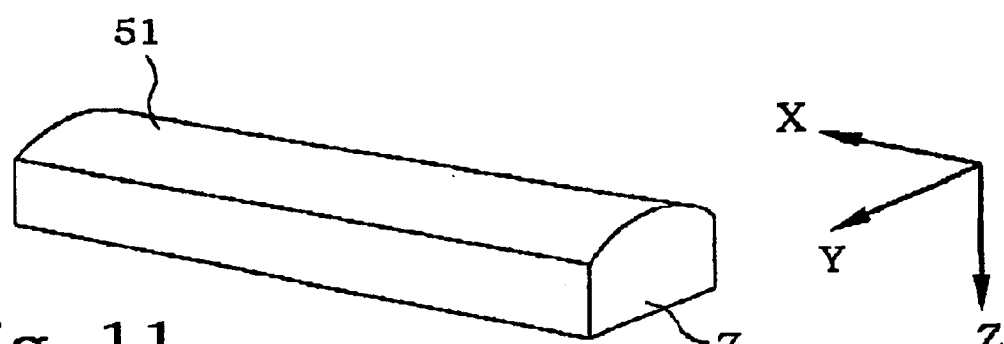
FIG. 11 is an illustration of a rail possible to use in a motor according to the present invention.

The shape of the rail can be made so that alignment errors are minimized. If the drive element is more rigidly attached, e.g. glued on the spring or flexible printed circuit board, a cylindrically shaped surface 51 of the rail 7, as shown in FIG. 11, will compensate for alignment errors. More or less the same effect can be achieved with spherically shaped drive pads on a flat rail.

The spring means creating the force N in the orthogonal direction (z direction), can be made in several different ways. As has been mention earlier, it can be integrated in a sandwich arrangement, or it can simply be the flexible printed circuit board itself as has be explained in the published international patent application WO00/44208. In many applications a separate spring is, however, advantageous and the motor behavior can be optimized with the various properties of the spring means.

The first property to consider is the orthogonal force, i.e. the force in the z direction. The optimum orthogonal force is dependent on parameters such as the friction between drive pad and rail, the stiffness of the drive pad and the rail, the roughness of the rail, the voltage applied to the drive element, the type of electromechanical material used, the actual design of the drive element, the desired tangential force etc. Typically the orthogonal force has to be optimized experimentally. The orthogonal force will determine the tangential force through the number of drive elements and the friction coefficient between the drive pad and rail.

The next parameter to consider is the spring constant of the spring. Normally this is directly connected to the tolerances in the motor construction and the spring constant should be chosen so that the spring force does not vary more than some 10% within the combined tolerance range allowed.

Figure 12:
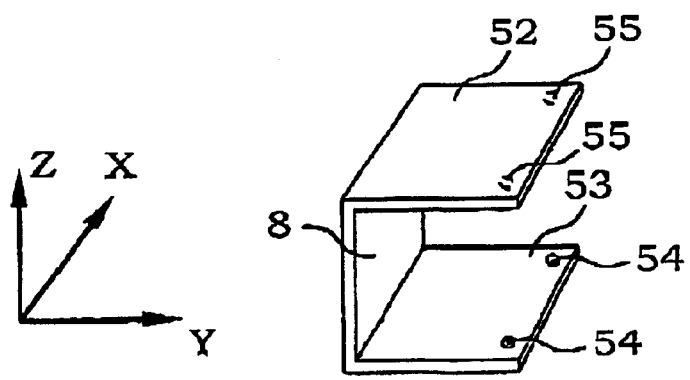
FIG. 12 illustrates an embodiment of a floating spring unit according to the present invention.

One very important parameter is also the rotational stiffness around the axis y, as illustrated in FIG. 12. A spring means 8 is formed in a general U-shape with an upper flange 52 and a lower flange 53 parallel to the upper flange in an assembled state. Depending on application, various shapes will be necessary, e.g. for tubular arrangements springs might have C-shapes. Note the orientation of the coordinate system. With too large flexibility in the spring means, the motor response will be very poor when sending a number of drive pulses. The motor drive element will then be allowed to rotate around the y axis. A higher number of pulses will consequently be needed before the drive element can create a sufficient tangential force along the x axis. The stiffness is normally adjusted according to the step length of the drive element and the desired response given as the number of steps to create a certain motion.

Depending on motor construction, the parallelism of the areas in contact with the drive element will be more or less important. As has been mentioned earlier, moments around the x axis should be minimized Otherwise, the motor function could be highly limited. With parallel flanges 52, 53, this moment is reduced. It is, however, possible to get a negligible moment by self-centering of the spring. If the spring is pressing on half-spheres or similar components, without having any other contact with the rest of the motor, a very small moment can be accomplished. The spring is thereby floating within the motor arrangement. Typically, as will be explained more in detail below, this is made with an arrangement with 2 or more drive element, but a similar situation can be accomplished also with only one drive element. In this case the spring will have one of the flanges 53 in contact with the rest of the motor at positions 54, while the spring flange 52 is in contact with the motor at positions 55. The positions 54 should be attached to the motor in mirror positions of the half-sphere positions with respect to a plane parallel to the contact plane between drive pad and rail. To keep the drive element from sliding away, the contact positions consist of dimples, holes or other geometrical features that give a resulting force N essentially only in the z direction.

The spring material should preferably be a material that has a low creep or plastic deformation during the lifetime of the motor. It is often desired to have an absorbing film inside the spring to reduce noise, reduce undesired vibrations and increase friction between the half-spheres and the spring. This film could be a thin plastic film that is deposited on the spring or the spring could consist of two different materials integrated together, e.g. metal and plastic or fiber reinforced plastic.

Figure 13:
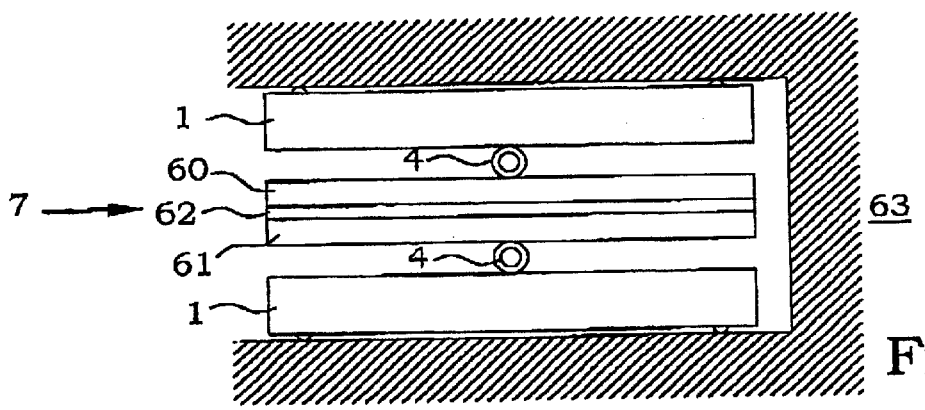
FIG. 13 illustrates a rail having an internal spring means.

In some applications it is not convenient to have an external spring pressing the drive elements against the rail. It might be difficult to find the place for the spring that should have the proper performance. In these cases the drive rail 7 itself can achieve the spring action, as illustrated in FIG. 13. Here a motor having two drive elements 1 arranged symmetrically on each side of a rail 7 is illustrated. In the simplest case the rail 7 is divided in two parts 60, 61 with an intermediate resilient material 62. A rigid structure 63 limits the available space, and when the entire arrangement is fitted into the structure 63, the resilient material 62 becomes compressed, which in turn gives rise to a spring force.

The spring action can also be accomplished by various geometric solutions such as leaf springs, bending joints etc.

Figure 14:
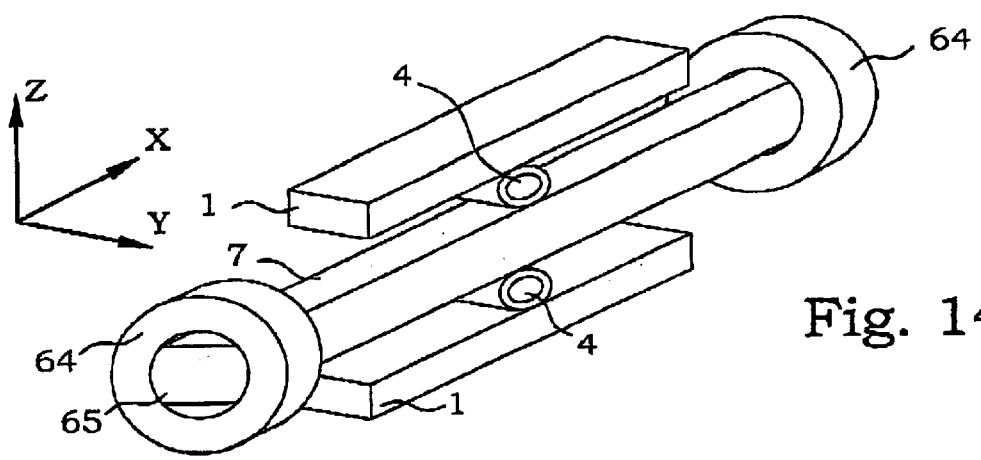
FIG. 14 illustrates an embodiment of a motor with double drive elements.
Figure 15:
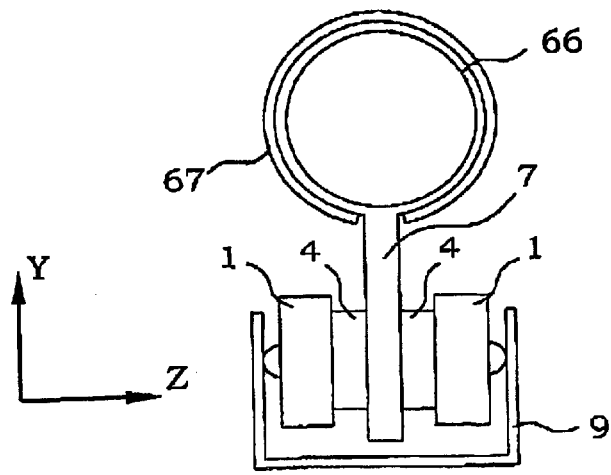
FIG. 15 illustrates another embodiment of a motor with double drive elements.

Motors can be made with one or several drive elements, as seen e.g. in FIG. 13. Using two drive elements that are place opposed to each other a stable operation is typically achieved, as illustrated in FIG. 14. Here, two drive elements 1 are actuating by its drive pads 4 on opposite sides of the rail 7. The rail 7 will normally to a certain extent be kept in place by the action of the drive pads 4, but the rail 7 will also need additional support from other components in the motor or application. Tube shaped drive pads 4 will prevent rotation around the x-axis. Typically, cylindrical bearing surfaces 64 preventing rotation around, and translation along, the y- and z-axes are needed. These cylindrical surface 64 could be arranged symmetrically on two sides of the rail 7, e.g. a rod shaped rail 7 with two flat faces 65 to drive on. Alternatively, as illustrated in FIG. 15, such cylindrical surfaces could be part of a side-mounted application were tubular components 66 are moving in tubular supporting structures 67.

Figure 16A:
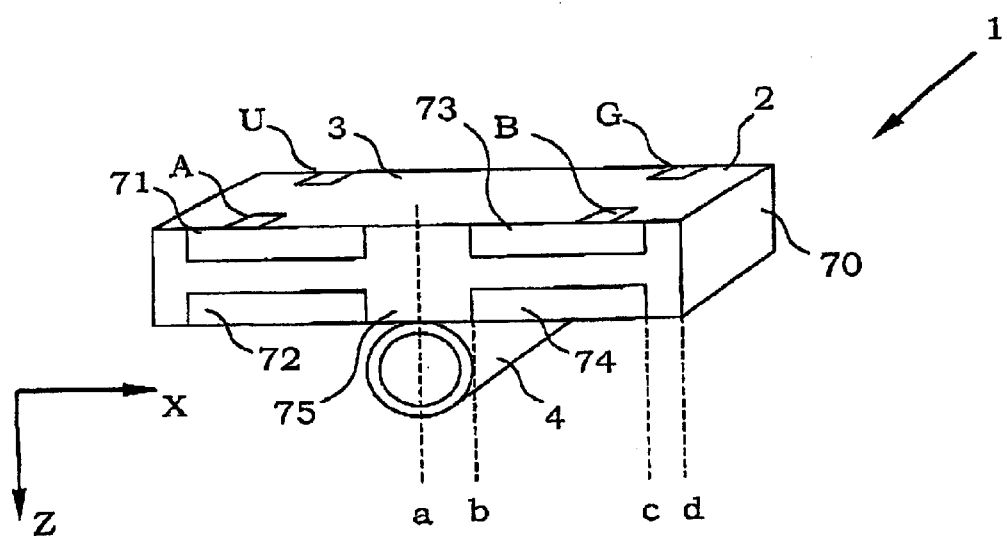
FIGS. 16a–b illustrates an embodiment of a drive element useful in a motor according to the present invention.
Figure 16B:
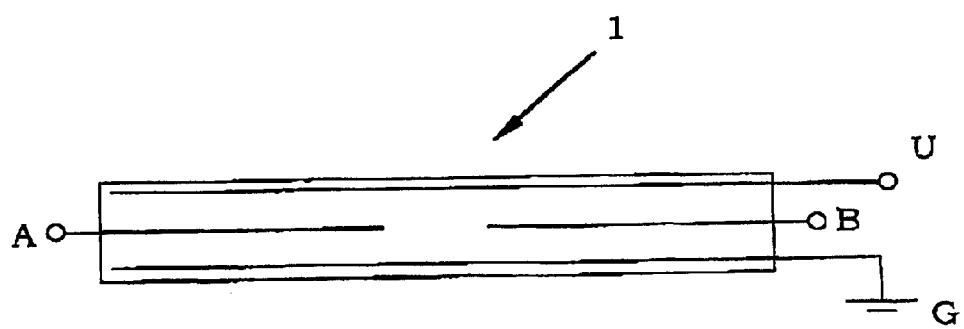

In FIG. 16a is an embodiment of a monolithic element 70 that works well as the main part of a drive element 1 according to the present invention shown. Note that the figure is turned upside down compared with the earlier figures. The monolithic element 70 consists of a soft piezoelectric material that gives a high strain for low voltages. The monolithic element 70 comprises four active sections 71–74. Each active section 71–74 is a multilayer and the active sections 71–74 are arranged in two pairs, creating two bending sections 2, 3 interconnected by a passive center section 75. The bending sections are electrically controlled by one electrode A and B, respectively, together with two other constant voltage electrodes, ground G and voltage U. The connection principle is shown in FIG. 16b. Naturally, a similar arrangement can be made with hard piezoelectric material but the electrodes and polarization will be changed. Both constant voltage electrode pads U and G in FIG. 16a can then connect to ground.

In order to make the drive element 1 simple to place and solder on a carrier, such as a flexible printed circuit board, the contact pads A, B, G, U for the voltages should be placed on the flat side of the drive element 1, directed upwards in FIG. 16a. The active volumes 71–74 can furthermore be minimized to save energy. The volume in between the active volumes 71–74 in one bending section, e.g. the volume between 71 and 72 in FIG. 16a does not contribute much to the bending action and could therefore be left inactivated. Also, the active volumes do not need to extend all the way to the middle, a, of the drive element 1 but could finish at a position b. This is because this center passive volume 75 does not contribute much to the useful bending action. The active sections 71–74 could also finish at a position c at a distance away from the respective end of the drive element 1 for the same reason, leaving a respective passive end portion.

The motors are typically driven in one direction with electrode A and in the other direction with electrode B. These electrodes are normally called motor phases. When driving with phase A, the phase B can be either be floating or be connected to a fixed voltage. Two-phase driving is also possible, but it is often most convenient to use one-phase operation. Since several different driving mechanisms can be obtained, the direction of movement of the rail or body will depend on the actual choice of motor design. Normally, the best performance is obtained when the motor is adjusted so that driving with electrode A will result in a movement to the left in FIG. 16a. This mechanism then resembles a travelling wave mechanism.

The waveform is not very crucial and the use of a square wave instead of a sinusoidal wave results in an improvement in performance. Drive frequencies could be from sub-sonic to ultrasonic frequencies. Standard voltage supplies according to prior art can easily be used by anyone skilled in the art for providing the appropriate voltage signals. For positioning purposes it is convenient to use one or a few pulses intermittently. There is often a desire to drive the motor with very small voltages and this can be accomplished by the use of an inductive component in series with the motor electrode. The inductance can be selected to be close to or in resonance with the motor phase and the voltage amplitude over the phase will become much higher than the voltage amplitude applied to the series-connected inductance and motor phase.

It will be understood by those skilled in the art that various modifications and changes may be made to the present invention without departure from the scope thereof, which is defined by the appended claims.

References

U.S. Pat. No. 5,453,653
U.S. Pat. No. 5,136,200
U.S. Pat. No. 5,233,258
EP 0 978 887
WO 00/44208

What is claimed is:

1. An electromechanical motor, comprising:
   stator, having a driving element and a backbone portion;
   body to be moved in a main displacement direction by said driving element;
   resilient means arranged to apply a normal force between said driving element and said body;
   said driving element in turn comprising:
   a first and a second bending section, generally elongated along said main displacement direction, connected in series to each other in said main displacement direction;
   said first and said second bending section each having a first and a second portion interconnected along said main displacement portion and essentially parallel to a drive surface of said body;
   said first portion being an active electromechanical element presenting a dimension changeability in said main displacement direction; and
   drive pad arranged to actuate on said body and arranged at a point close to the center of said driving element;
   at least one of said drive pad and said body being elastic.

2. The electromechanical motor according to claim 1, wherein said drive pad has a stiffness that is lower than a stiffness of said body.

3. The electromechanical motor according to claim 1, wherein said drive pad has an elasticity allowing for assimilating a non-negligible portion of an energy of a travelling wave applied to said driving element.

4. The electromechanical motor according to claim 1, wherein said drive pad has an elasticity restricting a time of compression when a travelling wave passes to less than half a cycle time of said travelling wave.

5. The electromechanical motor according to claim 1, wherein said drive pad is positioned at the center of said driving element, with respect of said main displacement direction.

6. The electromechanical motor according to claim 5, further comprising attachment means between said drive element and said backbone arranged in vicinity of an outer end of a respective one of said bending sections, restricting substantial translational motion of said driving element in relation to said backbone.

7. The electromechanical motor according to claim 6, wherein said drive element is substantially symmetric around said drive pad.

8. The electromechanical motor according to claim 6, wherein said attachment means comprises supporting means with a protruding portion having a convex surface supporting against a counter surface.

9. The electromechanical motor according to claim 8, wherein said protruding portion is comprised in said drive element and said counter surface is comprised in one of said backbone and said resilient means.

10. The electromechanical motor according to claim 9, wherein said protruding portion has a half-spherical shape.

11. The electromechanical motor according to claim 8, wherein said protruding portion is comprised in one of said backbone and said resilient means, and said counter surface is comprised in said drive element.

12. The electromechanical motor according to claim 6, wherein said attachment means comprises means for restricting translational motions of said drive element in said main displacement direction.

13. The electromechanical motor according to claim 12, wherein said means for restricting translational motions of said drive element in said main displacement direction are attached to said drive element at said interconnection between said first and second portions or closer to said body than said interconnection between said first and second portions.

14. The electromechanical motor according to claim 12, wherein said means for restricting translational motions of said drive element in said main displacement direction are attached to said drive element at solder pads on said drive element.

15. The electromechanical motor according to claim 1, wherein said second portion is an active electromechanical element presenting a dimension changeability in said main displacement direction.

16. The electromechanical motor according to claim 1, wherein said second portion is a non-electromechanically active portion.

17. The electromechanical motor according to claim 16, wherein said second portion is a metal sheet.

18. The electromechanical motor according to claim 1, wherein said first and second bending sections are connected via a passive portion, to which said drive pad is attached.

19. The electromechanical motor according to claim 1, wherein said body has negligible bending vibrations in a operation frequency range of said electromechanical motor.

20. The electromechanical motor according to claim 1, wherein said body has a surface roughness on a surface facing said drive pad that is at most in the same order of magnitude as the movement of said drive pad perpendicular to said main displacement direction.

21. The electromechanical motor according to claim 1, wherein said body has a surface facing said drive pad having a cylindrical shape.

22. The electromechanical motor according to claim 1, wherein said resilient means has a spring force varying less than 10% within an allowed range of tolerances of said motor.

23. The electromechanical motor according to claim 1, wherein said resilient means has a general C- or U-shape, contacting said body and said backbone or drive element only at contact portions on opposite sides of said C- or U-shape.

24. The electromechanical motor according to claim 23, wherein said contact portions comprise protrusions having convex surfaces.

25. The electromechanical motor according to claim 24, wherein said body, backbone or drive element comprises dimples or holes for receiving said protrusions.

26. The electromechanical motor according to claim 23, wherein said contact portions support against protrusions at said body and/or said backbone having convex surfaces.

27. The electromechanical motor according to claim 24, wherein said contact portions comprise dimples or holes for receiving said protrusions.

28. The electromechanical motor according to claim 1, wherein said resilient means is comprised in said body.

29. The electromechanical motor according to claim 1, further comprising means for inducing travelling waves in said drive element, said travelling waves having a frequency near a resonance frequency of said drive element.

30. The electromechanical motor according to claim 29, wherein said resonance frequency of said drive element is a resonance frequency of a bending mode.

31. The electromechanical motor according to claim 30, wherein said bending mode has an odd number of nodes.

32. An electromechanical motor, comprising:

stator, having a driving element and a backbone portion;

body to be moved in a main displacement direction by said driving element;

resilient means arranged to apply a normal force between said driving element and said body;

said driving element in turn comprising:

a first and a second bending section, generally elongated along said main displacement direction, connected in series to each other in said main displacement direction;

said first and said second bending section each having a first and a second portion interconnected along said main displacement portion and essentially parallel to a drive surface of said body;

said first portion being an active electromechanical element presenting a dimension changeability in said main displacement direction; and drive pad arranged to actuate on said body and arranged at a point close to the center of said driving element;

whereby one of said backbone and said resilient means is arranged to restrict translational motion of said driving element away from said body perpendicular to said main displacement direction, but allow translational motion of said driving element towards said body perpendicular to said main displacement direction.

33. The electromechanical motor according to claim 32, wherein contact means between said one of said backbone and said resilient means, and said drive element comprises a protruding portion having a convex surface supporting against a counter surface.

34. The electromechanical motor according to claim 33, wherein said protruding portion is comprised in said drive element and said counter surface is comprised in said one of said backbone and said resilient means.

35. The electromechanical motor according to claim 34, wherein said protruding portion has a half-spherical shape.

36. The electromechanical motor according to claim 33, wherein said protruding portion is comprised in on of said backbone and said resilient means, and said counter surface is comprised in said drive element.

37. An electromechanical motor, comprising:

stator, having a driving element and a backbone portion;

body to be moved in a main displacement direction by said driving element;

resilient means arranged to apply a normal force between said driving element and said body;

said driving element in turn comprising:

a first and a second bending section, generally elongated along said main displacement direction, connected in series to each other in said main displacement direction;

said first and said second bending section each having a first and a second portion interconnected along said main displacement portion and essentially parallel to a drive surface of said body;

said first portion being an active electromechanical element presenting a dimension changeability in said main displacement direction;

said second portion being a passive element; and drive pad arranged to actuate on said body and arranged at a point close to the center of said driving element.

38. The electromechanical motor according to claim 37, wherein said second portion of said first and second bending sections comprises a metallic sheet.

39. The electromechanical motor according to claim 38, wherein said second portion of said first and second bending sections further comprises a flexible printed circuit board.

40. The electromechanical motor according to claim 38, wherein said metallic sheet also forms said drive pad.

* * * * *